United States Patent
Menzel et al.

(10) Patent No.: US 9,335,355 B2
(45) Date of Patent: May 10, 2016

(54) ELECTRONIC DEVICE WITH LIQUID CONTACT SENSORS

(71) Applicant: Apple Inc., Cupertino, CA (US)

(72) Inventors: Brian C. Menzel, Sunnyvale, CA (US);
Kevin M. Keeler, Los Gatos, CA (US);
Jim Z. Huang, Sunnyvale, CA (US);
Parviz Mishkanian, San Jose, CA (US)

(73) Assignee: Apple Inc., Cupertino, CA (US)

( * ) Notice: Subject to any disclaimer, the term of this patent is extended or adjusted under 35 U.S.C. 154(b) by 181 days.

(21) Appl. No.: 13/787,669

(22) Filed: Mar. 6, 2013

(65) Prior Publication Data

US 2014/0253150 A1 Sep. 11, 2014

(51) Int. Cl.
*G01R 27/26* (2006.01)
*G01R 27/02* (2006.01)
*G06F 1/16* (2006.01)

(52) U.S. Cl.
CPC ............ *G01R 27/2605* (2013.01); *G01R 27/02* (2013.01); *G06F 1/1613* (2013.01)

(58) Field of Classification Search
CPC .. G01N 27/223; G01N 27/226; G01N 27/225
USPC ............................. 324/664; 340/604; 361/680
See application file for complete search history.

(56) References Cited

U.S. PATENT DOCUMENTS

| | | | | |
|---|---|---|---|---|
| 5,534,015 A * | 7/1996 | Kroll | ..................... | A61N 1/3956 607/5 |
| 5,606,264 A * | 2/1997 | Licari | ................... | G01N 27/048 324/696 |
| 5,654,643 A * | 8/1997 | Bechtel | ................... | G01N 27/02 324/663 |
| 5,728,289 A * | 3/1998 | Kirchnavy | ........... | G01N 27/404 204/409 |
| 6,222,376 B1 * | 4/2001 | Tenney, III | ........... | G01N 27/225 324/663 |
| 6,388,722 B1 | 5/2002 | Yoshii et al. | | |
| 6,411,353 B1 | 6/2002 | Yarita et al. | | |
| 6,603,319 B1 | 8/2003 | Kasahara et al. | | |
| 6,633,986 B1 * | 10/2003 | Sellers | ................... | G06F 1/1616 340/604 |
| 6,639,517 B1 * | 10/2003 | Chapman | ................ | G01M 3/16 137/312 |
| 6,885,201 B2 * | 4/2005 | Germiquet | ............ | G01F 23/265 324/663 |
| 7,142,425 B2 * | 11/2006 | Tomioka | .................. | G06F 1/203 165/80.4 |
| 7,206,037 B2 | 4/2007 | Nishio et al. | | |
| 7,571,637 B2 | 8/2009 | Chen et al. | | |
| 8,482,305 B2 | 7/2013 | Johnson | | |
| 8,886,971 B2 * | 11/2014 | Chuang | ..................... | G06F 1/26 713/300 |
| 9,071,046 B2 * | 6/2015 | Stevens | ..................... | H02H 5/00 |
| 2004/0036484 A1 * | 2/2004 | Tamai | ..................... | A61F 13/42 324/663 |
| 2004/0108861 A1 * | 6/2004 | Germiquet | ............ | G01F 23/265 324/663 |

(Continued)

*Primary Examiner* — Tung X Nguyen
*Assistant Examiner* — Dominic Hawkins
(74) *Attorney, Agent, or Firm* — Treyz Law Group, P.C.; G. Victor Treyz; Zachary D. Hadd

(57) ABSTRACT

Electronic devices may be accidentally exposed to liquid during operation. To detect liquid intrusion events, an electronic device may be provided with one or more electronic liquid contact sensors. The liquid contact sensors may have electrodes. Control circuitry may make measurements across the electrodes such as resistance and capacitance measurements to detect the presence of liquid. Liquid contact sensor data may be maintained in a log within storage in the electronic device. The liquid contact sensor data can be used to display information for a user of the electronic device or can be loaded onto external equipment for analysis. Liquid contact sensor electrodes may be formed from metal traces on substrates such as printed circuits, from contacts in a connector, from contacts on an integrated circuit, or from other conductive electrode structures.

31 Claims, 19 Drawing Sheets

(56) References Cited

U.S. PATENT DOCUMENTS

| | | | | |
|---|---|---|---|---|
| 2005/0218429 A1* | 10/2005 | Mazza | ............... | G01R 1/07378 257/209 |
| 2006/0021432 A1* | 2/2006 | Salzmann | ............. | G01F 23/243 73/304 R |
| 2006/0058069 A1* | 3/2006 | Garcia | ................ | H04B 1/3833 455/567 |
| 2006/0185187 A1* | 8/2006 | Kou | .................. | G01R 31/2849 34/282 |
| 2006/0208914 A1* | 9/2006 | Liu | ........................ | H04M 1/18 340/620 |
| 2007/0044542 A1* | 3/2007 | Barguirdjian | ..... | B32B 17/10036 73/73 |
| 2007/0295742 A1* | 12/2007 | Kheiri | ................ | G01N 33/4875 221/25 |
| 2008/0094232 A1* | 4/2008 | Yokote | ................. | G06F 1/1616 340/604 |
| 2010/0097557 A1* | 4/2010 | Nakanishi | .............. | G02F 1/1395 349/143 |
| 2010/0177498 A1 | 7/2010 | Choi et al. | | |
| 2011/0102346 A1* | 5/2011 | Orsley | .................... | G06F 3/044 345/173 |
| 2011/0109333 A1 | 5/2011 | Porjo et al. | | |
| 2011/0113878 A1* | 5/2011 | Ohshima | ............... | G01F 23/266 73/304 C |
| 2011/0120770 A1 | 5/2011 | Yokonuma | | |
| 2011/0140603 A1* | 6/2011 | Lin | ....................... | H01J 65/048 315/56 |
| 2011/0279931 A1* | 11/2011 | Nakamura | ............. | G01M 3/16 361/42 |
| 2011/0284268 A1* | 11/2011 | Palaniswamy | ........... | H05K 3/28 174/251 |
| 2012/0038374 A1* | 2/2012 | Johnson | ................ | G01M 3/045 324/694 |
| 2012/0101744 A1* | 4/2012 | Matsuura | ............. | G01F 15/068 702/45 |
| 2012/0326733 A1* | 12/2012 | Kato | .................. | G01N 33/2852 324/674 |

\* cited by examiner

ELECTRONIC DEVICE WITH LIQUID CONTACT SENSORS

BACKGROUND

This relates generally to electronic devices and, more particularly, to electronic devices with liquid intrusion sensing capabilities.

Electronic devices such as computers and cellular telephones are often accidentally exposed to moisture. For example, a portable device may become wet when exposed to rain or when accidentally dropped in water.

It can be difficult to troubleshoot damaged electronic devices without knowledge of whether or not a device has been exposed to liquid. If care is not taken, wasteful repair attempts may be made on a permanently damaged device or a device that has not been exposed to damaging liquids may be needlessly scrapped without identifying a reparable fault.

Liquid contact indicators are available that are formed from dye-impregnated paper. When exposed to moisture, the dye will diffuse into the paper and give rise to a visible mark such as a red spot. This type of dye-based liquid contact indictor may be installed within an electronic device in a location that is visible from the exterior of a device, thereby allowing a technician to easily inspect the status of the indicator to determine whether or not the electronic device has been exposed to liquid.

Dye-based liquid contact indicators provide only limited information about liquid contact events and exhibit irreversible state changes. This can make it difficult or impossible to troubleshoot failures. It is also not possible for a device to take actions in real time in response to a state change in a dye-based liquid contact indictor.

It would therefore be desirable to be able to provide electronic devices with improved liquid contact detection capabilities.

SUMMARY

Electronic devices may be accidentally exposed to liquid during operation. To detect liquid intrusion events in which moisture enters the housing of an electronic device, the electronic device may be provided with one or more electronic liquid contact sensors. The liquid contact sensors may have electrodes. Control circuitry may make measurements across the electrodes such as resistance and capacitance measurements to detect the presence of liquid.

Liquid contact sensor data may be maintained in a log within storage in the electronic device. The liquid contact sensor data can be used to display information for a user of the electronic device and can be loaded onto external equipment for analysis. Corrective actions may be taken in real time in response to liquid detection. For example, sensitive electronic components within the electronic device can be powered down in response to liquid detection to prevent component damage. Liquid detection information may also be used for debugging. For example, information from liquid contact sensors can be used in determining whether an electronic device is reparable or should be replaced and can be used in improving future device designs for enhanced immunity to liquid exposure damage.

Liquid contact sensor electrodes may be formed from metal traces on substrates such as printed circuits. For example, a pair of electrodes may be formed on the surface of a rigid or flexible printed circuit. Electrode structures may be provided with interdigitated fingers to enhance sensitivity. In multilayer printed circuits, electrodes may be formed from exposed edge portions of embedded metal traces. In electronic devices with connectors such as data port connectors, liquid contact sensor electrodes may be formed from connector pins. Integrated circuit contacts may also be used as liquid contact sensor electrodes.

Further features, their nature and various advantages will be more apparent from the accompanying drawings and the following detailed description of the preferred embodiments.

DETAILED DESCRIPTION

Illustrative electronic devices having one or more electronic liquid contact sensors are shown in FIGS. 1, 2, 3, and 4.

Figure 1:
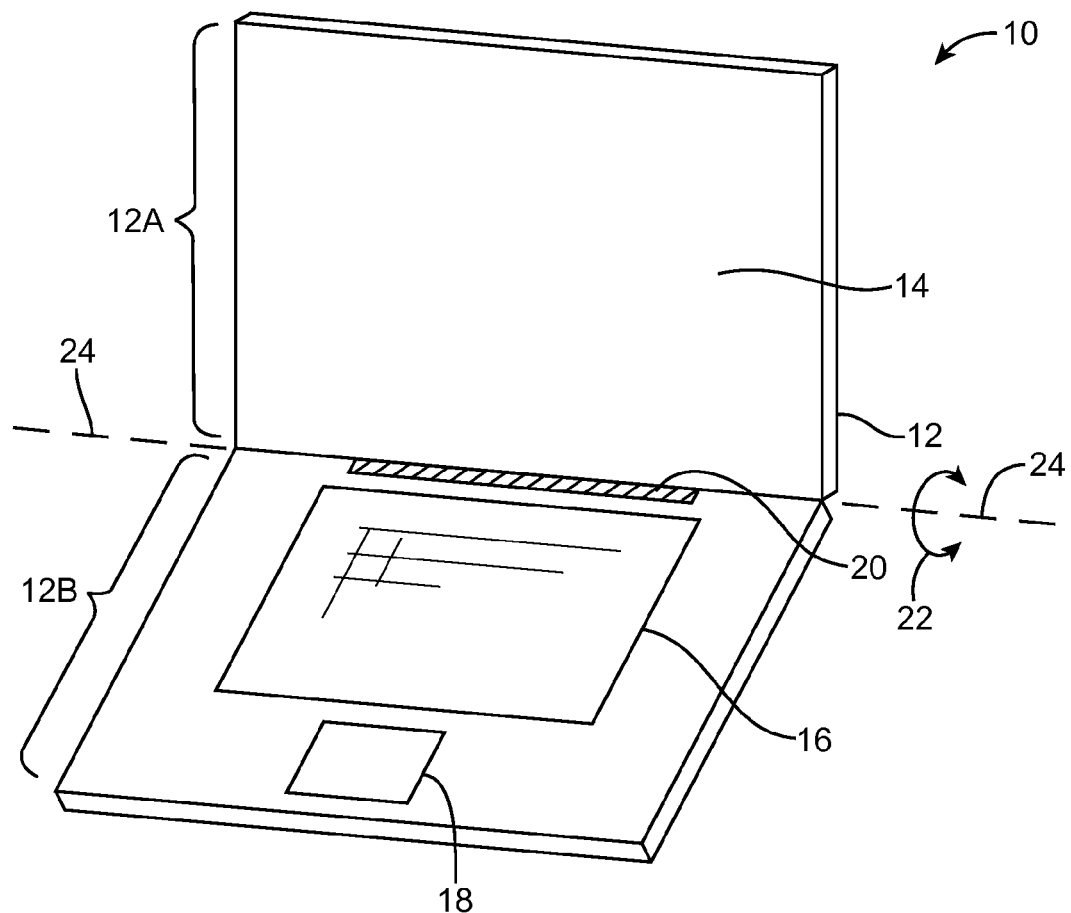
FIG. 1 is a perspective view of an illustrative electronic device such as a laptop computer with liquid contact sensor structures in accordance with an embodiment.

Electronic device 10 of FIG. 1 has the shape of a laptop computer and has upper housing 12A and lower housing 12B with components such as keyboard 16 and touchpad 18. Device 10 has hinge structures 20 (sometimes referred to as a clutch barrel) to allow upper housing 12A to rotate in directions 22 about rotational axis 24 relative to lower housing 12B. Display 14 is mounted in upper housing 12A. Upper housing 12A, which may sometimes be referred to as a display housing or lid, is placed in a closed position by rotating upper housing 12A towards lower housing 12B about rotational axis 24.

Figure 2:
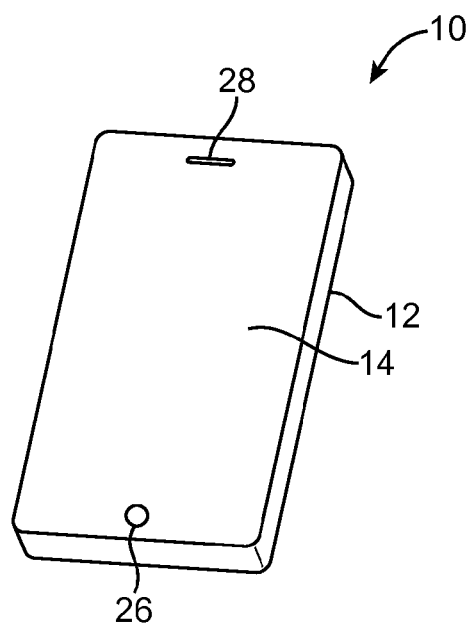
FIG. 2 is a perspective view of an illustrative electronic device such as a handheld electronic device with liquid contact sensor structures in accordance with an embodiment.

FIG. 2 shows an illustrative configuration for electronic device 10 based on a handheld device such as a cellular telephone, music player, gaming device, navigation unit, or other compact device. In this type of configuration for device 10, housing 12 has opposing front and rear surfaces. Display 14 is mounted on a front face of housing 12. Display 14 may have an exterior layer that includes openings for components such as button 26 and speaker port 28.

Figure 3:
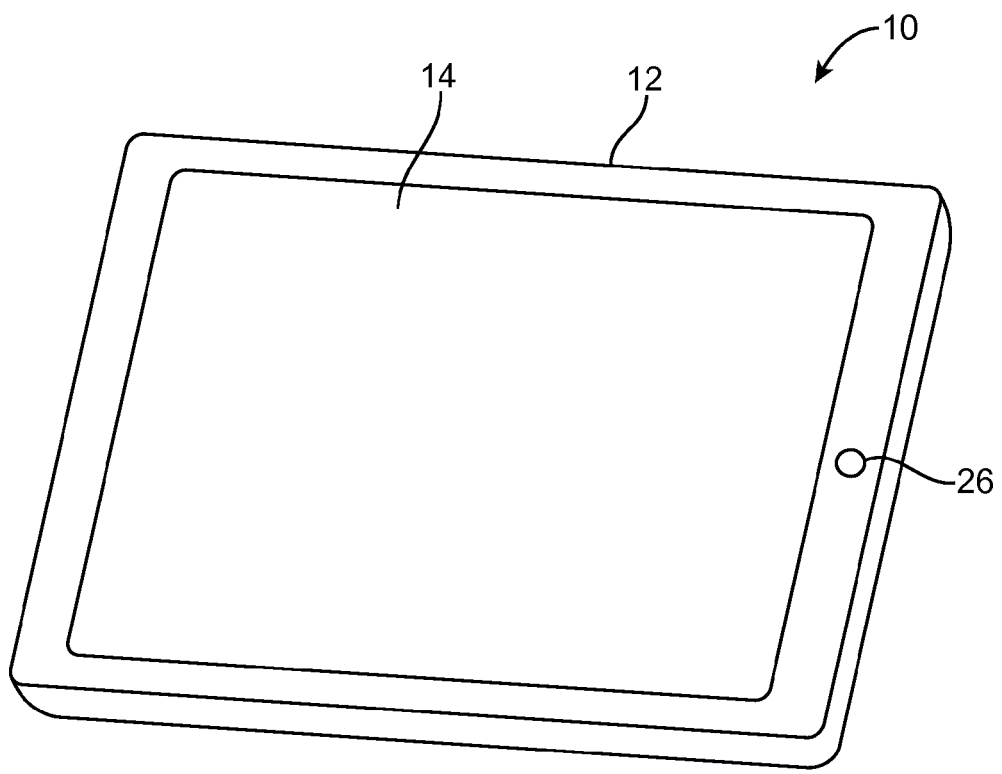
FIG. 3 is a perspective view of an illustrative electronic device such as a tablet computer with liquid contact sensor structures in accordance with an embodiment.

In the example of FIG. 3, electronic device 10 is a tablet computer. In electronic device 10 of FIG. 3, housing 12 has opposing planar front and rear surfaces. Display 14 is mounted on the front surface of housing 12. As shown in FIG. 3, display 14 has an external layer with an opening to accommodate button 26.

Figure 4:
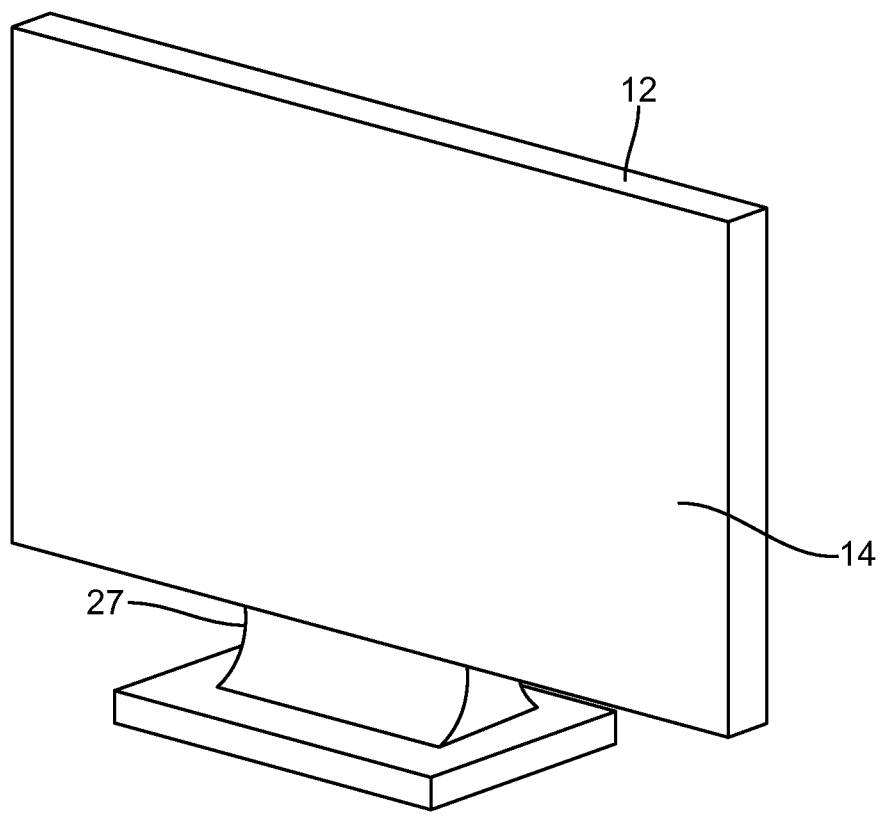
FIG. 4 is a perspective view of an illustrative electronic device such as a computer display with liquid contact sensor structures in accordance with an embodiment.

FIG. 4 shows an illustrative configuration for electronic device 10 in which device 10 is a computer display or a computer that has been integrated into a computer display. With this type of arrangement, housing 12 for device 10 is mounted on a support structure such as stand 27. Display 14 is mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, is formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components or other suitable image pixel structures.

A display cover layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member.

Figure 5:
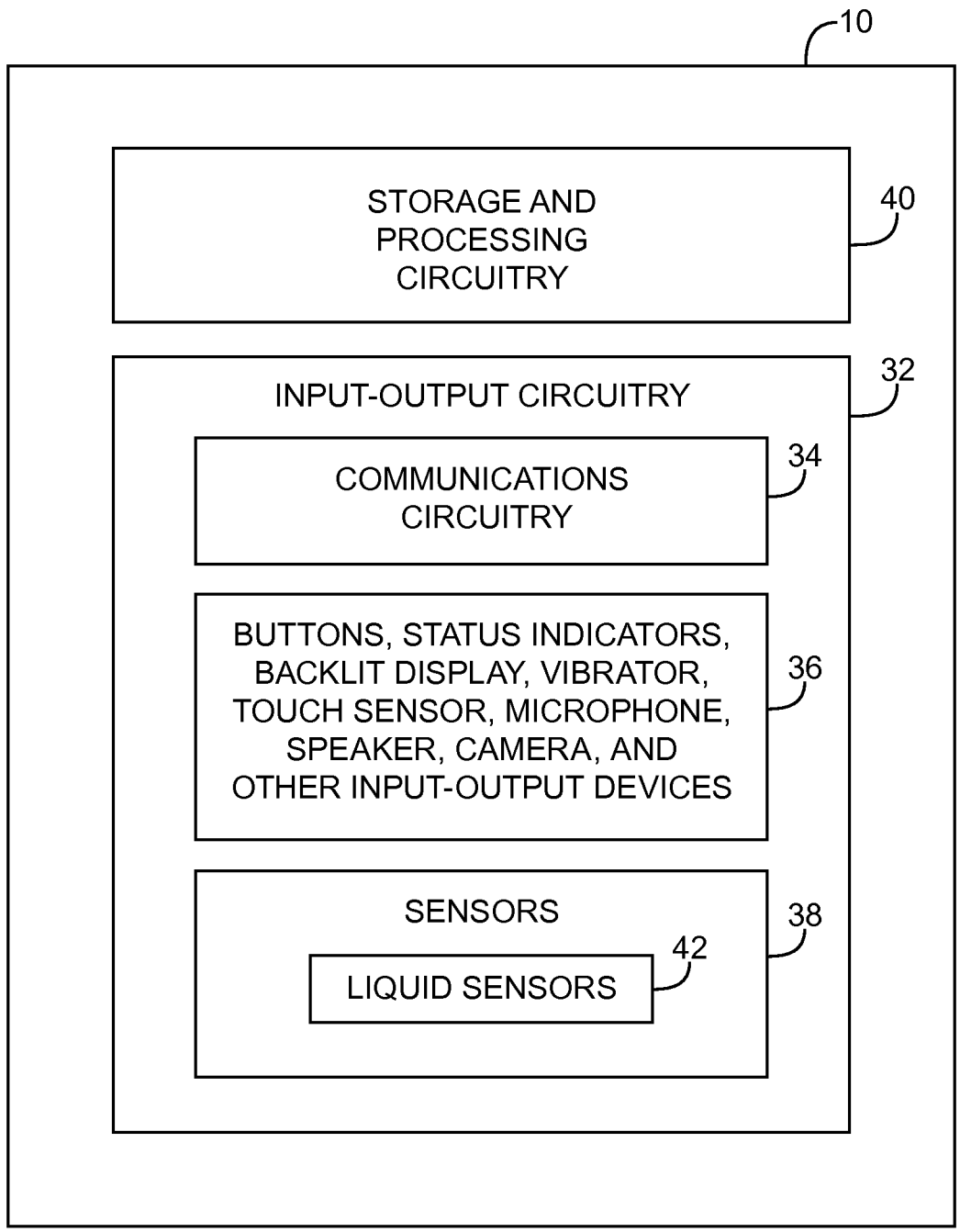
FIG. 5 is a schematic diagram of an illustrative electronic device of the type that may be provided with liquid contact sensor structures in accordance with an embodiment.

A schematic diagram of device 10 is shown in FIG. 5. As shown in FIG. 5, electronic device 10 includes control circuitry such as storage and processing circuitry 40. Storage and processing circuitry 40 includes one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 40 is used in controlling the operation of device 10. The processing circuitry may be based on a processor such as a microprocessor and other integrated circuits.

With one suitable arrangement, storage and processing circuitry 40 is used to run software on device 10 such as internet browsing applications, email applications, media playback applications, operating system functions, software for capturing and processing images, software for implementing functions associated with gathering and processing sensor data, etc.

Input-output circuitry 32 is used to allow data to be supplied to device 10 and to allow data to be provided from device 10 to external devices.

Input-output circuitry 32 can include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 of FIG. 5 includes input-output devices 36 such as buttons, joysticks, click wheels, scrolling wheels, a touch screen such as display 14, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensors 38 of FIG. 5 may include an ambient light sensor for gathering information on ambient light levels, a proximity sensor, an accelerometer, and other sensors. As shown in FIG. 5, sensors 38 may include one or more electronic liquid contact sensors 42. Liquid contact sensors 42 may include electrodes that are coupled to control circuitry in device 10 such as circuitry 40. The control circuitry may include resistance measurement circuitry for making resistance measurements across the electrodes, circuitry for making capacitance measurements across the electrodes, circuitry for digitizing analog sensor measurements, multiplexing circuitry that allows sensor signals to be gathered from more than one sensor 42, communications circuitry for transmitting sensor data to other circuitry that is internal or external to device 10, and/or processing circuits for processing sensor data and taking suitable action.

Using liquid contact sensors 42, device 10 may detect situations in which circuitry within device 10 should be shut down to minimize or avoid potential damage due to the presence of excessive moisture and/or may detect situations in which moisture has likely damaged components within device 10. Information on moisture damage may be used to troubleshoot damaged devices, may be used to improve future device designs, etc.

Figure 6:
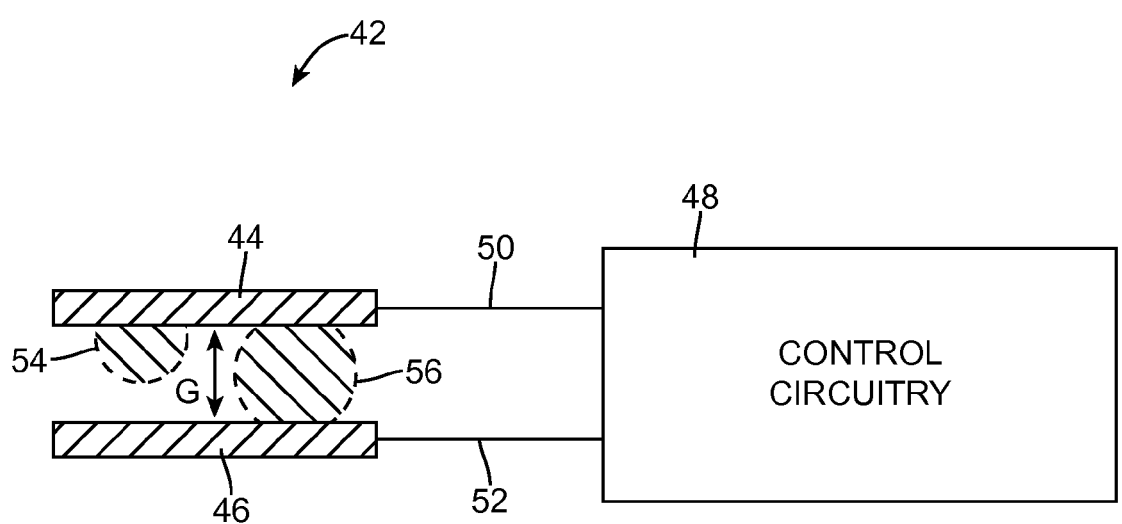
FIG. 6 is a diagram of an illustrative electronic liquid contact sensor and associated control circuitry for use in an electronic device in accordance with an embodiment.

FIG. 6 is a diagram of an illustrative liquid contact sensor being used to detect moisture in device 10. Liquid contact sensor 42 of FIG. 6 has electrodes 44 and 46. Electrodes 44 and 46 are formed from conductive materials such as metal. As an example, electrodes 44 and 46 may be formed from patterned metal traces on a substrate such as a plastic carrier, glass or ceramic layer, or a printed circuit substrate such as a rigid printed circuit board (e.g., a printed circuit formed from fiberglass-filled epoxy) or a flexible printed circuit (e.g., a printed circuit formed from a flexible layer of polyimide or other sheet of flexible polymer). Electrodes 44 and 46 may also be formed using other conductive structures in device 10 such as housing structures, brackets, connectors, contacts in connectors (e.g., pins in a data port connector or audio jack connector), or other conductive structures.

Control circuitry 48 (e.g., circuitry such as circuitry 40 of FIG. 5) may be coupled to liquid contact sensor electrodes 44 and 46 using paths such as conductive lines 50 and 52. Electrodes 44 and 46 may be separated by a gap G. Air, plastic, printed circuit board material, or other dielectric may be present in gap G between electrodes 44 and 46. Control circuitry 48 may measure a resistance value, a capacitance value, or other electrical parameter associated with electrodes 44 and 46 to determine whether moisture is present in sensor 42. For example, in the absence of moisture, a resistance of R1 may be present across electrodes 44 and 46. In the presence of a drop of liquid such as liquid 56 that bridges gap G, control circuitry 48 may measure a reduced resistance value of R2 across electrodes 44 and 46. As another example, control circuitry 48 may detect a change in capacitance across electrodes 44 and 46 when moisture is introduced (e.g., when moisture drop 56 bridging gap G is present and/or when a drop such as drop 54 on electrode 44 is present). By making periodic electrical measurements such as resistance and/or capacitance measurements on liquid contact sensor electrodes 44 and 46, device 10 can monitor device 10 for exposure to moisture.

Figure 7:
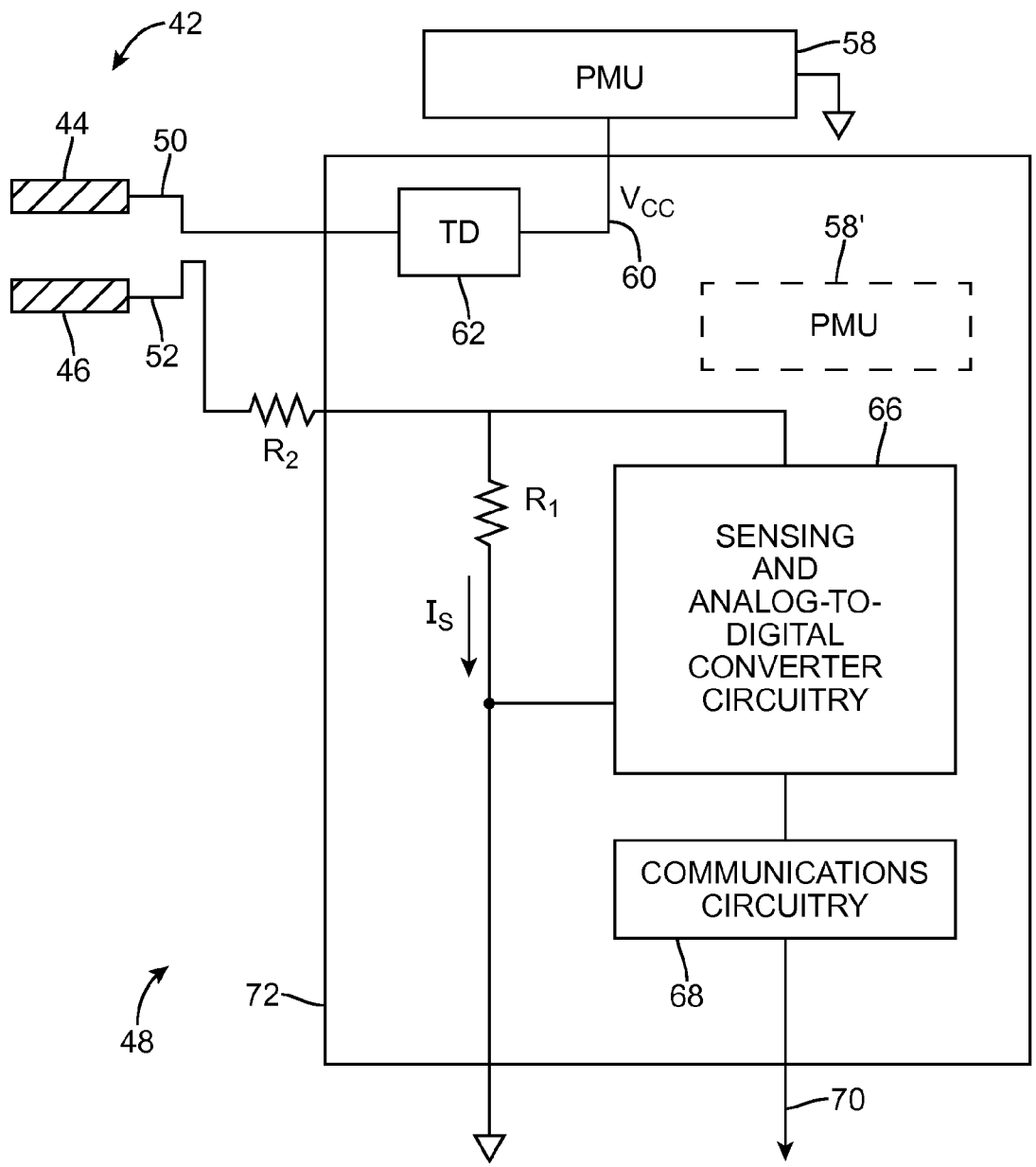
FIG. 7 is a circuit diagram showing how sensing and analog-to-digital converter circuitry in an integrated circuit may be used in monitoring an electronic liquid contact sensor in an electronic device in accordance with an embodiment.

FIG. 7 is a circuit diagram showing illustrative control circuitry 48 for making resistance-based liquid contact sensor measurements. With the configuration of FIG. 7, power (e.g., direct-current power supply voltage Vcc) may be applied to electrode 44 through circuitry 62 (e.g., a diode and a control transistor or other suitable circuitry). In the absence of liquid, the resistance between electrodes 44 and 46 will be high (essentially infinite). In the presence of liquid, a reduced finite resistance value may be measured across electrodes 44 and 46 by circuitry 48.

As shown in FIG. 7, electrode 46 may be coupled to integrated circuit 72 by current limiting resistor R2. Resistor R2 may limit the maximum amount of current that flows between electrodes 44 and 46 in the presence of moisture, thereby preventing damage to circuitry 48. If desired, components such as current limiting resistor R2 may be incorporated into an integrated circuit such as integrated circuit 72. The configuration of FIG. 7 in which current limiting resistor R2 has been implemented as a stand-alone discrete electrical component is merely illustrative.

Integrated circuit 72 may be an application-specific integrated circuit, a processor, or other suitable integrated circuit in device 10 (e.g., circuit 72 may be part of storage and processing circuitry 40). Integrated circuit 72 may receive power supply voltage Vcc from power management unit 58 (e.g., a power management unit integrated circuit) or, if desired the circuitry of power management unit 58 may be included in integrated circuit 72 as indicated schematically by power management unit circuitry 58' of FIG. 7 (i.e., circuitry 48 can be incorporated into a power management unit integrated circuit or other integrated circuit in device 10).

Sensing and analog-to-digital converter circuitry 66 may be coupled across current sensing resistor R1. When moisture is present across electrodes 44 and 46, a current Is will flow through electrodes 44 and 46 and across resistor R1, producing a voltage drop of Is*R1 across resistor R1. Circuitry 66 may include an amplifier or other circuitry coupled across resistor R1 for measuring the voltage drop. Analog-to-digital converter circuitry within circuitry 66 may be used to digitize this measured voltage, thereby producing a digital output that is indicative of the resistance between electrodes 44 and 46.

When no liquid is present on sensor 42, the resistance measured by circuitry 48 will be high. When liquid is present on sensor 42, the measured resistance will be low. Liquid contact sensor data (e.g., resistance measurements) from circuitry 66 may be passed to output path 70 using communications circuitry 68. Output path 70 may be coupled to control circuitry 40 for internal processing in device 10 and/or may be coupled to communications circuitry 34 for conveying the liquid contact sensor data to external equipment. Communications circuitry 68 may be circuitry for handling serial communications (e.g., I$^2$C serial bus circuitry or Universal Serial Bus circuitry), circuitry for handling parallel bus communications and/or other circuitry for transmitting liquid contact sensor measurements from circuitry 48 of FIG. 7 (e.g., integrated circuit 72) to other circuitry in device 10.

Figure 8:
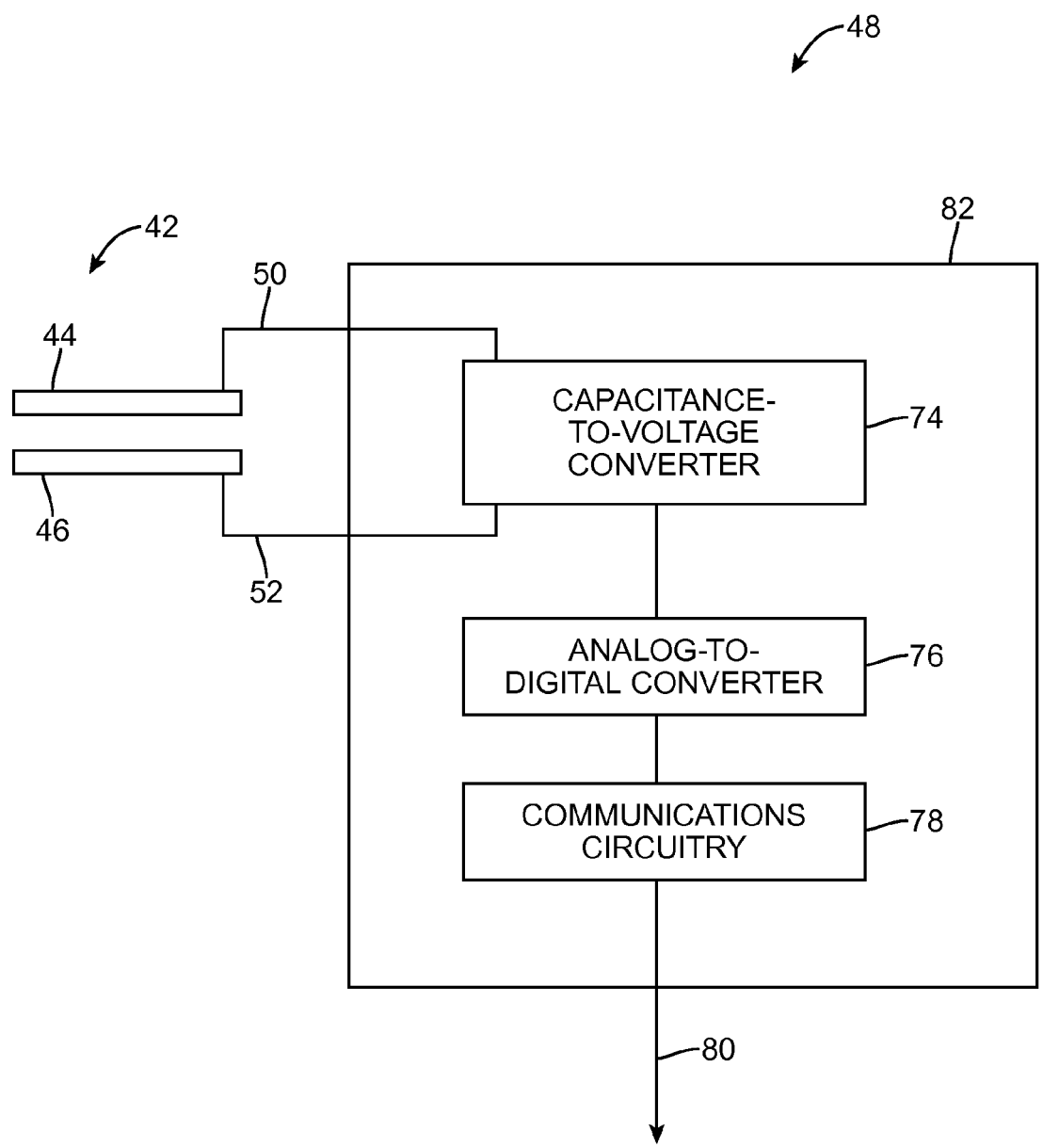
FIG. 8 is a circuit diagram showing how capacitance-to-voltage converter circuitry may be used in processing signals from an electronic liquid contact sensor in an electronic device in accordance with an embodiment.

FIG. 8 is a circuit diagram of an illustrative liquid contact sensor circuit that makes capacitance measurements between electrodes 44 and 46 in sensor 42. With the configuration of FIG. 8, integrated circuit 82 is coupled to sensor 42 using paths 50 and 52. Integrated circuit 82 may be an application-specific integrated circuit, a processor, or other suitable integrated circuit in device 10 (e.g., part of storage and processing circuitry 40). If desired, multiple integrated circuits may be used in implementing the circuitry of circuit 82.

Capacitance-to-voltage converter 74 or other capacitance sensing circuitry may be coupled across electrodes 44 and 46. During operation, capacitance-to-voltage converter 74 measures how much capacitance is exhibited across electrodes 44 and 46 and will produce a corresponding voltage output. The capacitance across electrodes 44 and 46 will rise and fall depending on the moisture content in sensor 42, thereby allowing circuitry 48 to determine whether or not sensor 42 has been exposed to liquid.

The voltage output of capacitance-to-voltage converter circuitry 74 is provided to analog-to-digital converter 76. Analog-to-digital converter 76 digitizes the analog voltage output of circuitry 74 and provides a corresponding digital capacitance measurement signal to communications circuitry 78. Liquid contact sensor data (e.g., capacitance measurements) from circuitry 76 may be passed to output path 80 using communications circuitry 78. Communications circuitry 78 may be circuitry for handling serial communications (e.g., I²C serial bus circuitry or Universal Serial Bus circuitry), circuitry for handling parallel bus communications and/or other circuitry for transmitting liquid contact sensor measurements from circuitry 48 (e.g., integrated circuit 82) to control circuitry 40 and/or communications circuitry 32 in device 10.

Figure 9:
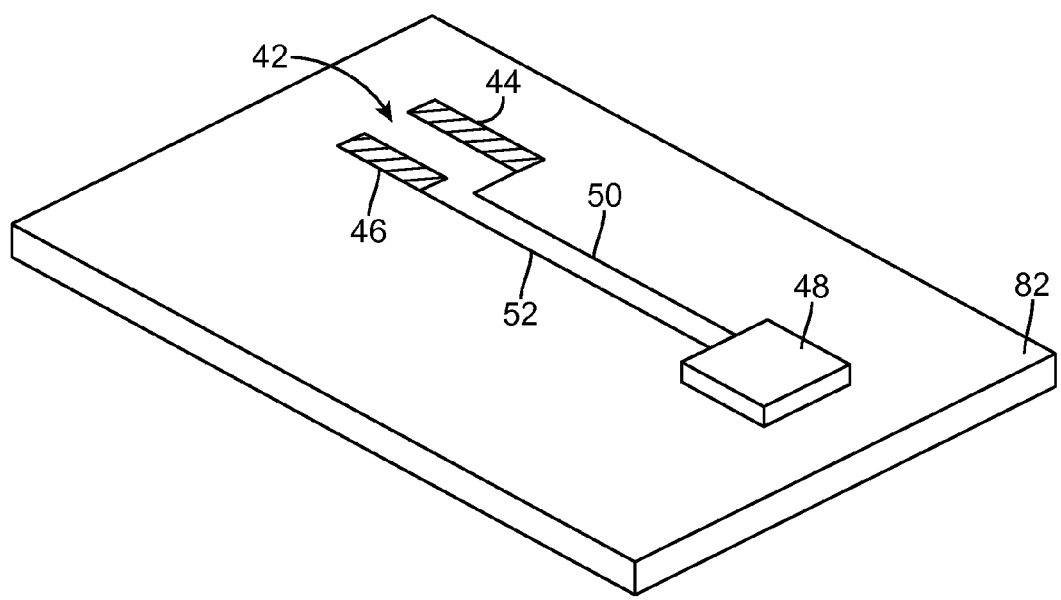
FIG. 9 is a perspective view of an illustrative substrate such as a printed circuit having sensing circuitry coupled to liquid contact sensor electrodes in accordance with an embodiment.

Sensor electrodes 44 and 46 may, if desired, be formed as metal contact pads on the surface of a substrate. This type of arrangement is shown in FIG. 9. As shown in FIG. 9, electrodes 44 and 46 may be formed on substrate 82. Lines 50 and 52 electrically couple electrodes 44 and 46 to circuitry 48. Lines 50 and 52 may be formed from surface traces on substrate 82 and/or from internal interconnect traces embedded within substrate 82.

Substrate 82 may be formed from dielectric such as plastic, ceramic, glass, or other insulating material. For example, substrate 82 may be a plastic carrier, a rigid printed circuit board, or a flexible printed circuit. Sensors 44 and 46 may be formed from one or more layers of patterned metal on the surface of substrate 82. For example, sensors 44 and 46 may be formed from one or more layers of metal traces patterned using photolithographic patterning equipment. If desired, multiple components such as one or more integrated circuits for circuitry 32 and 40 of FIG. 5 may be mounted on substrate 82.

Figure 10:
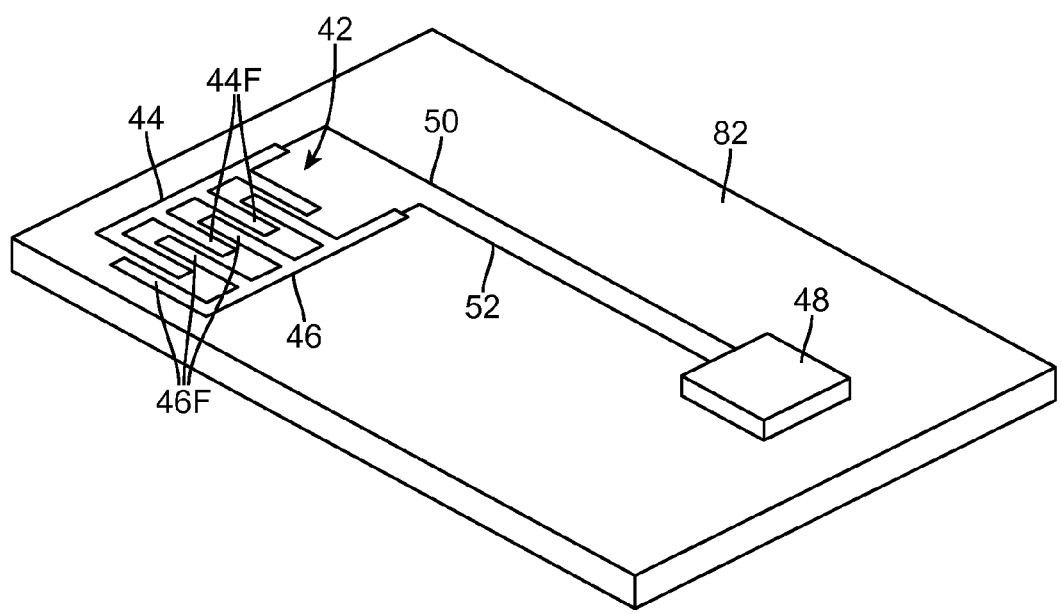
FIG. 10 is a perspective view of an illustrative substrate such as a printed circuit having sensing circuitry coupled to a liquid contact sensor structure having sensor electrodes with interdigitated fingers in accordance with an embodiment.

As shown in FIG. 10, electrodes 44 and 46 may have interdigitated fingers to help enhance the sensitivity of liquid contact sensor 42. In the example of FIG. 10, liquid contact sensor electrode 44 has four fingers 44F that are interleaved with four corresponding fingers 46F in liquid contact sensor electrode 46. Liquid contact sensors with other numbers of fingers and/or fingers with different shapes (e.g., bends, etc.) may be used if desired.

Electrodes 44 and 46 may be formed from one or more layers of metal. Metal with high conductivity such as copper may be used to reduce electrode resistance. Metals such as gold may exhibit high corrosion resistance and may therefore be suitable for use in forming an exposed outer electrode layer.

Figure 11:
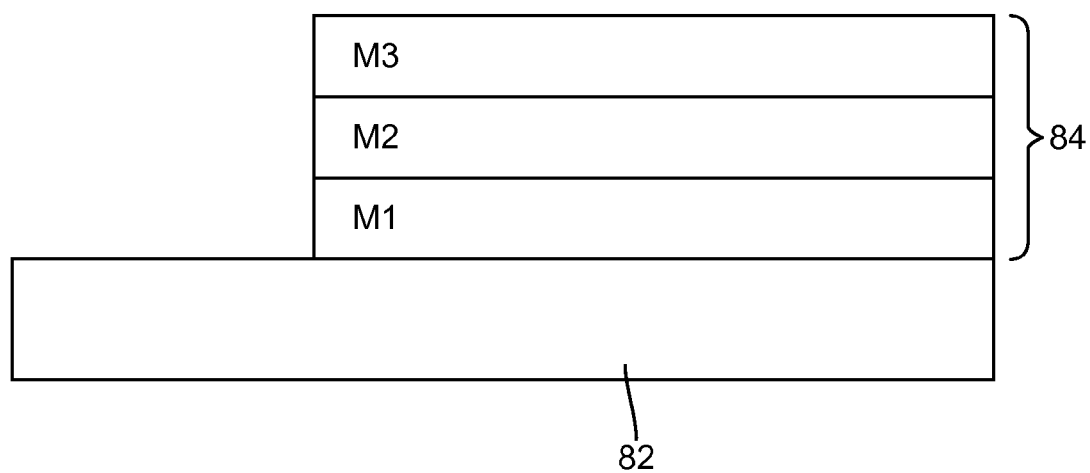
FIG. 11 is a cross-sectional side view of an illustrative liquid contact sensor electrode formed from multiple layers of conductive material on a substrate such as a printed circuit board in accordance with an embodiment.

A cross-sectional side view of a metal structure of the type that may be used in forming electrodes 44 and 46 and/or for conductive paths 50 and 52 is shown in FIG. 11. As shown in FIG. 11, metal trace 84 (e.g., electrode 44, electrode 46, conductive line 50, and/or conductive line 52) may be formed from multiple metal layers such as metal layers M1, M2, and M3. Layers M1, M2, and M3 may be deposited using physical vapor deposition, chemical vapor deposition, electrochemical deposition, or other suitable metal deposition techniques. Traces such as trace 84 may be patterned using photolithography (as an example).

Trace 84 may be formed on a substrate such as substrate 82 (e.g., a rigid printed circuit board, a flexible printed circuit, a plastic carrier, etc.). With one suitable arrangement, trace layer M1 may be a high-conductivity metal such as copper, trace layer M3 may be an inert metal coating such as gold, and trace layer M2 may be formed from a metal such as nickel that serves as a barrier layer to prevent the gold of layer M3 from migrating into the copper of layer M1.

If desired, electrodes formed from metal traces such as trace 84 or other conductive electrode structures may be encapsulated using a covering layer of insulating material such as a polymer layer (sometimes referred to as encapsulant or an encapsulant layer). The encapsulation layer may be formed from a dielectric material that conforms to the surface shape of the electrodes or may have other suitable shapes. Encapsulant may be dispensed in liquid form, by spraying, using spin-on processes, using physical vapor deposition, etc. Organic and/or inorganic materials may be used. As an example, layer M3 of trace 84 may be formed from an organic or inorganic dielectric encapsulation layer instead of from a metal layer. The presence of an encapsulation layer on the surface of the electrode may help prevent the electrode from becoming damaged (e.g., due to oxidation from exposure to air, moisture, or other environmental contaminants). Even though the electrodes are covered with dielectric, control circuitry 48 such as capacitance-to-voltage converter 74 of FIG. 8 may still make capacitance measurements using the electrodes to detect the presence of liquid.

Figure 12:
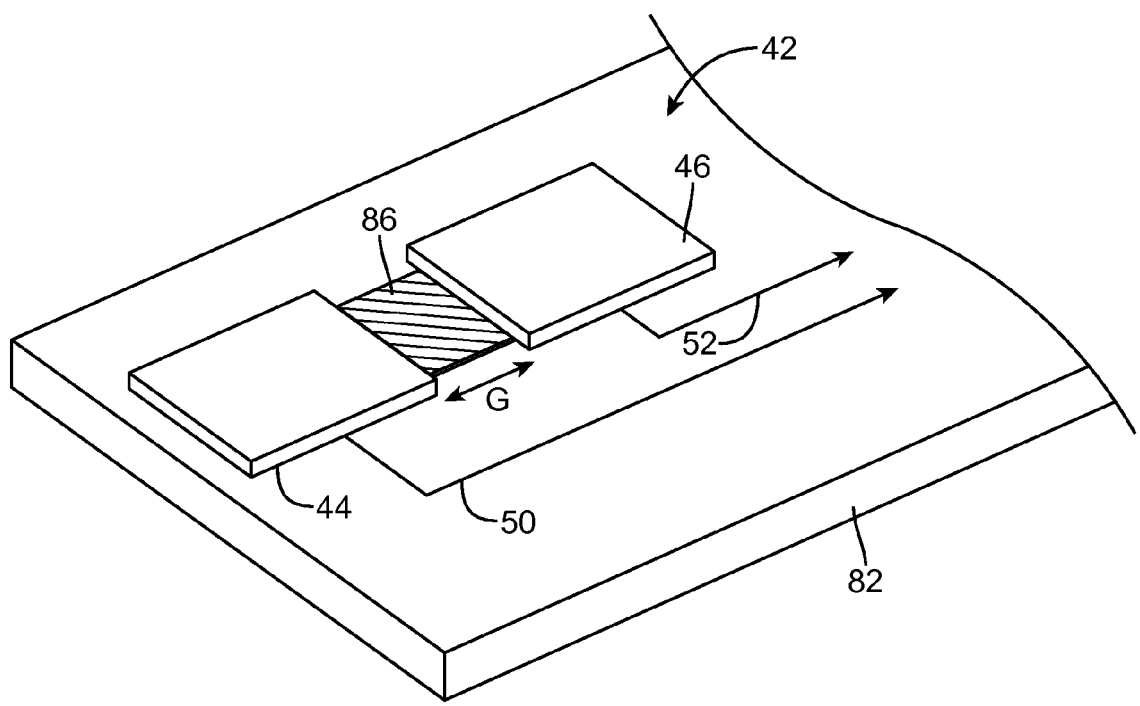
FIG. 12 is a perspective view of an illustrative liquid contact sensor structure having two electrodes and a hydrophilic coating covering a portion of a substrate that is located between the two electrodes in accordance with an embodiment.

As shown in FIG. 12, liquid contact sensor 42 may include structures such as pad 86. Pad 86 may be located adjacent to electrodes 44 and 46. For example, pad 86 may be located in gap G between electrodes 44 and 46. Pad 86 may be formed from a hydrophilic material such as polyurethane. The presence of hydrophilic structure 86 may help enhance the sensitivity of liquid contact sensor 42 to moisture by ensuring that any moisture that is present in the vicinity of sensor 42 will be drawn between electrodes 44 and 46 for detection. If desired, part of the hydrophilic structure may be formed on top of portions of electrodes 44 and 46.

Figure 13:
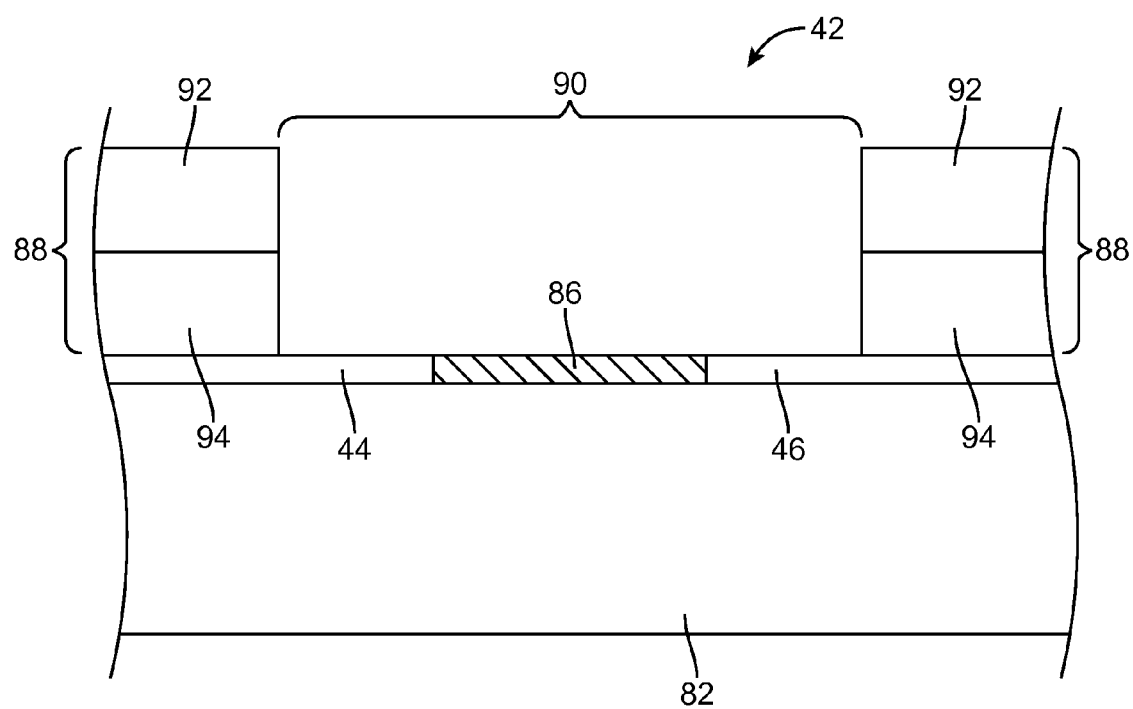
FIG. 13 is a cross-sectional side view of an illustrative liquid contact sensor structure having a hydrophilic coating and sensor electrodes formed in openings in a solder mask layer and a hydrophobic overcoat layer in accordance with an embodiment.

FIG. 13 is a cross-sectional side view of sensor 42 in a configuration in which part of the metal traces used in forming electrodes 44 and 46 has been covered with a coating. As shown in FIG. 13, optional hydrophilic structure 86 may be located in gap G between electrodes 44 and 46. Coating 88 may be formed from one or more layers of dielectric material. Electrodes 44 and 46 overlap opening 90 in coating 88. Opening 90 in coating 88 may allow moisture to reach hydrophilic structure 86 and bridge electrodes 44 and 46.

Coating 88 may include layers such as solder mask layer 94 and conformal coating 92. Solder mask 94 may be formed from a layer of polymer such as epoxy or polyimide. Conformal coating 92 may be formed from a layer of material such as parylene. Conformal coating 92 may be hydrophobic, which may help drive moisture into opening 90 onto hydrophilic structures 86 and/or electrodes 44 and 46 of liquid contact sensor 42.

Figure 14:
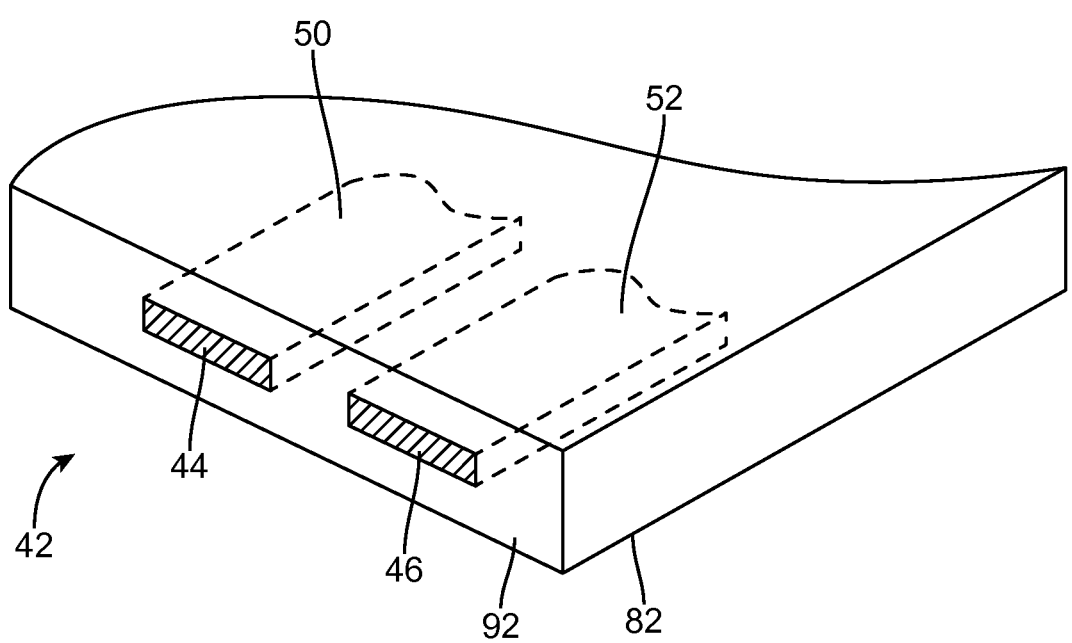
FIG. 14 is a perspective view of an illustrative liquid contact sensor having sensor electrodes formed from portions of embedded metal traces that are exposed along the edge of a substrate such as printed circuit in accordance with an embodiment.

There may be limited room available within device 10 for implementing liquid contact sensor 42. FIG. 14 shows how substrate area may be conserved by forming sensor 42 from electrode structures on an edge of substrate 82 such as edge 92. As shown in FIG. 14, metal traces 50 and 52 may be formed as internal interconnect lines that are embedded within the interior of substrate 82 (e.g., traces 50 and 52 may be lines on an intermediate layer of a multilayer rigid printed circuit board or a multilayer flexible printed circuit). Electrodes 44 and 46 may be formed from the exposed edge portions of internal traces 50 and 52 that are present along printed circuit edge 92.

Figure 15:
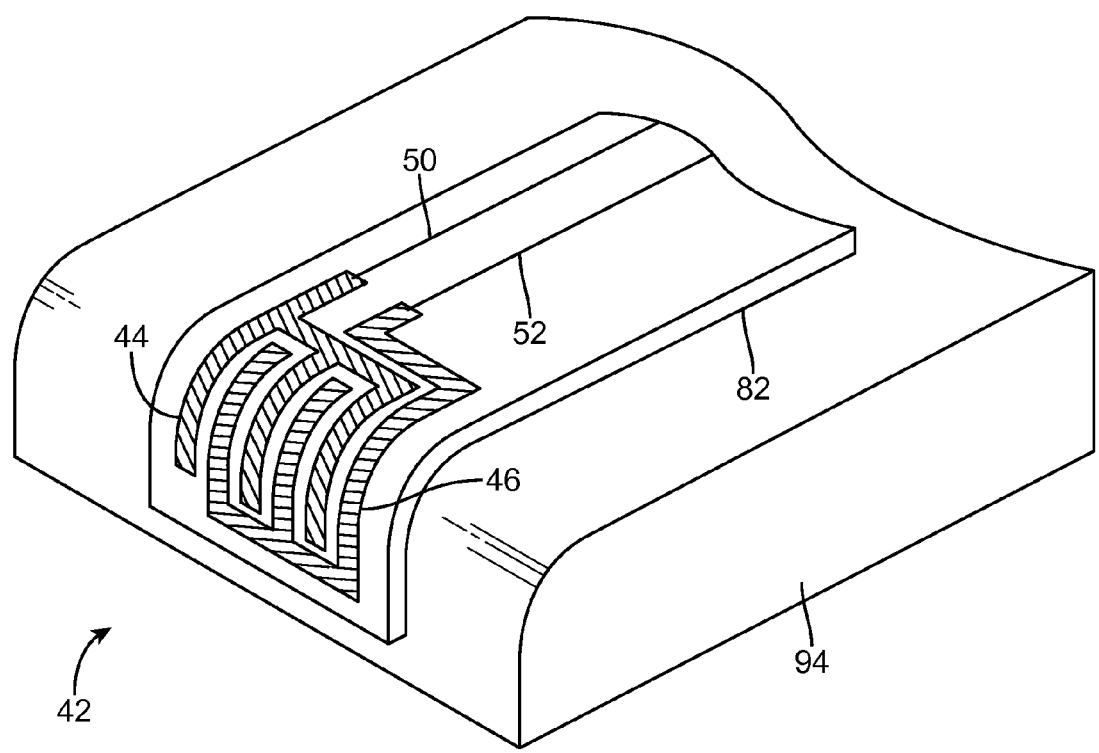
FIG. 15 is a perspective view of an illustrative liquid contact sensor structure formed from interdigitated sensor electrodes on a substrate such as a flexible printed circuit substrate mounted on a support structure in accordance with an embodiment.

In the illustrative configuration of FIG. 15, electrodes 44 and 46 for liquid contact sensor 42 have been formed from interdigitated finger structures on a flexible printed circuit substrate (substrate 82). Flexible printed circuit 82 of FIG. 15 is mounted on support structure 94. Support structures may be a plastic carrier, may be a metal bracket, may be an internal housing structure, may be formed from portions of a printed circuit board, may include an electrical component, may be a metal shielding can (e.g., an electromagnetic signal interference shielding can that covers an integrated circuit on a printed circuit), or may be other suitable structures for supporting flexible printed circuit 82.

If desired, flexible printed circuit 82 may be used as a substrate for other components in device 10. For example, electrical components such as integrated circuits and discrete components in circuitry 40 and 32 of FIG. 5 may be mounted on flexible printed circuit 82 of FIG. 15 in addition to using flexible printed circuit 82 of FIG. 15 as a substrate for electrodes 44 and 46 in sensor 42.

Electrodes 44 and 46 may be formed from contacts in a connector. Connector contacts, which are sometimes referred to as connector pins, may be formed from metal members, traces on support structures, or other metal contact structures.

Figure 16:
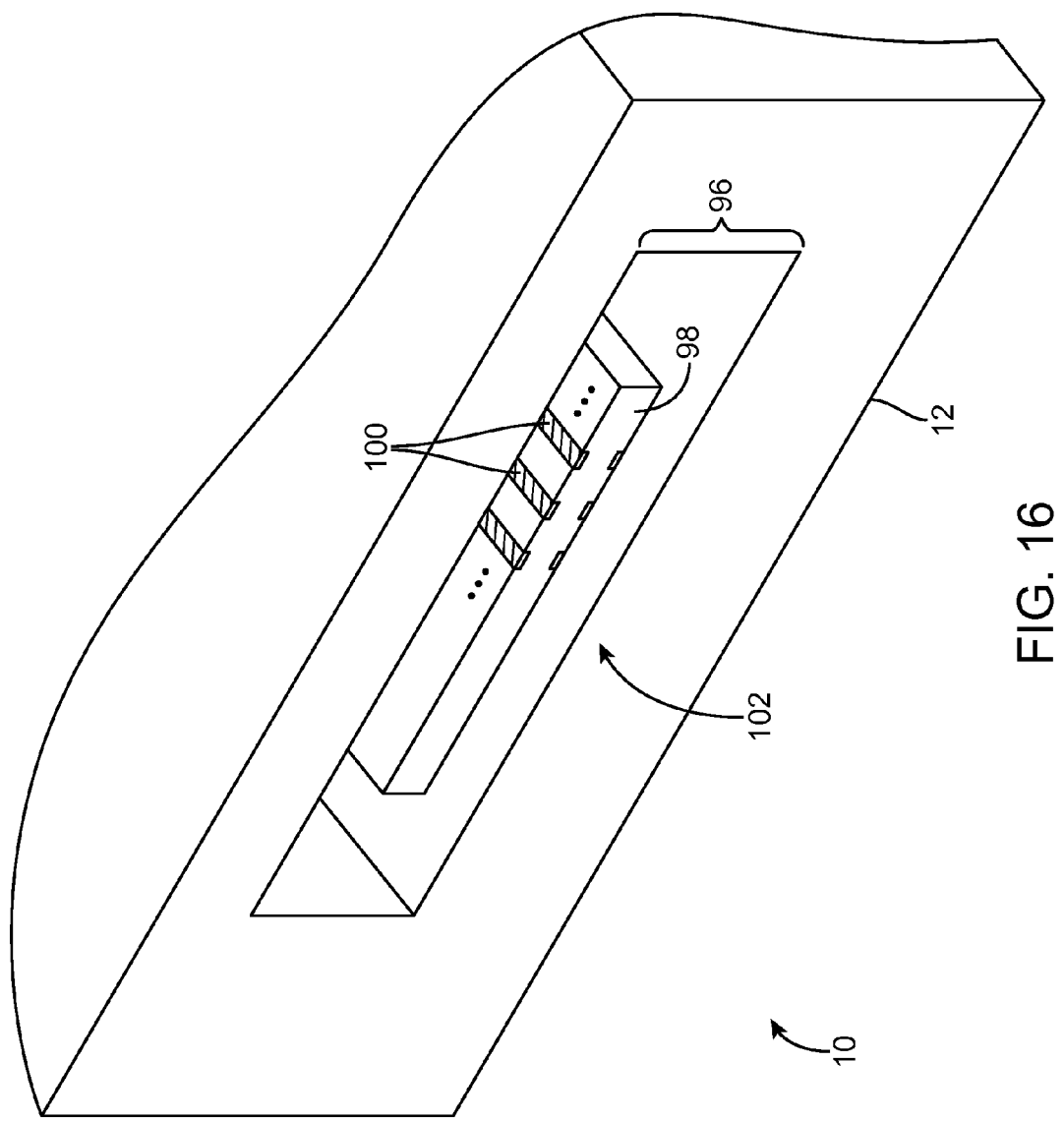
FIG. 16 is a perspective view of an illustrative connector of the type that may have connector contacts that serve as liquid contact sensor electrodes for a liquid contact sensor in accordance with an embodiment.

As shown in FIG. 16, device 10 may have a connector port such as connector 102. Connector 102 may be mounted in an opening such as opening 96 in housing 12. Connector 102 may have one or more support structures such as protruding tongue member 98. Tongue 98 may be formed from plastic or other dielectric. Contacts 100 may be formed from strips of metal, metal rods (e.g., cylindrical pins), metal traces on a support, or other connector contact structures. When connector 102 is coupled to a mating external connector, each of contacts 100 may make electrical connect with a corresponding contact in the external connector.

During use of device 10, contacts 100 may serve as sensor electrodes for liquid contact sensor 42. As an example, one of contacts 100 may serve as electrode 44 and another one of contacts 100 (e.g., an adjacent contact) may serve as electrode 46. The contacts that are used in forming sensor electrodes may be normally unused contacts in connector 102 (as an example). By using contacts 100 within connector 102 as sensor electrodes, sensor 42 can detect whether connector 102 is being exposed to moisture.

Figure 17:
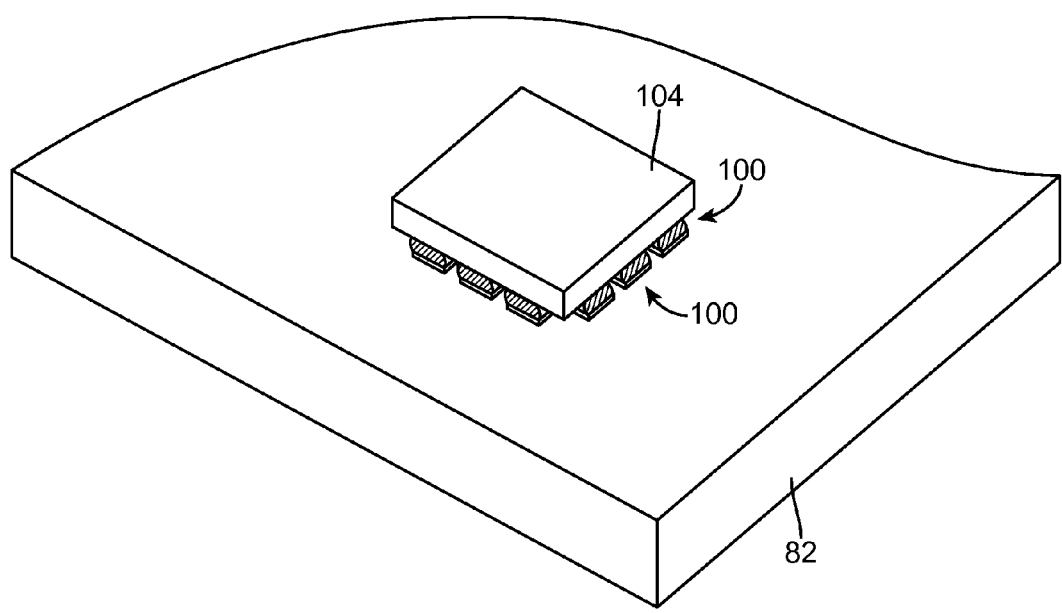
FIG. 17 is a perspective view of an illustrative component such as an integrated circuit having contacts such as solder pads with solder ball joints that may be used as liquid contact sensor electrodes in a liquid contact sensor in accordance with an embodiment.

FIG. 17 is a perspective view of an integrated circuit having contacts 100 (e.g., metal pads and solder balls or other solder joints coupled to corresponding pads on substrate 82). Contacts 100 may be used in forming electrodes in liquid contact sensor 42. For example, one of contacts 100 may be used in forming electrode 44 and one of contacts 100 may be used in forming electrode 46. Integrated circuit 104 may be used in forming sensor control circuitry 48 and/or other circuits in circuitry 32 and 40 of FIG. 5 (as an example). To allow moisture to contact the electrodes formed from contacts 100 of integrated circuit 104, the contacts 100 that are being used as sensor electrodes may be left exposed to the environment (e.g., by keeping them free of underfill sealant).

Different locations within device 10 may be subject to different types of moisture intrusion and may have varying levels of sensitivity to moisture. For example, a connector that is located within a port in housing 12 may sometimes be exposed to small amounts of moisture that can be tolerated without damaging device 10. Other locations in device 10 such as printed circuit boards populated with electrical components may be sensitive to even minute amounts of liquid. Portions of device 10 near an opening in housing 12 may be subject to more frequent exposures to liquid than portions of device 10 that are located deep within the interior of housing 12.

It may be desirable to gather information on liquid exposure events such as information on the amount of liquid that has entered device 10, the location at which the liquid has entered device 10, the time and date of each liquid intrusion, and information on the internal paths within device 10 along which liquid tends to flow. This information may be used in real time to take suitable actions such as turning off a display, turning of a sensitive integrated circuit, turning off other sensitive electrical components, or otherwise deactivating device circuitry 32 and/or 40. Information on liquid intrusion events may also be logged for use in determining the cause of device failures and improving future product designs.

Figure 18:
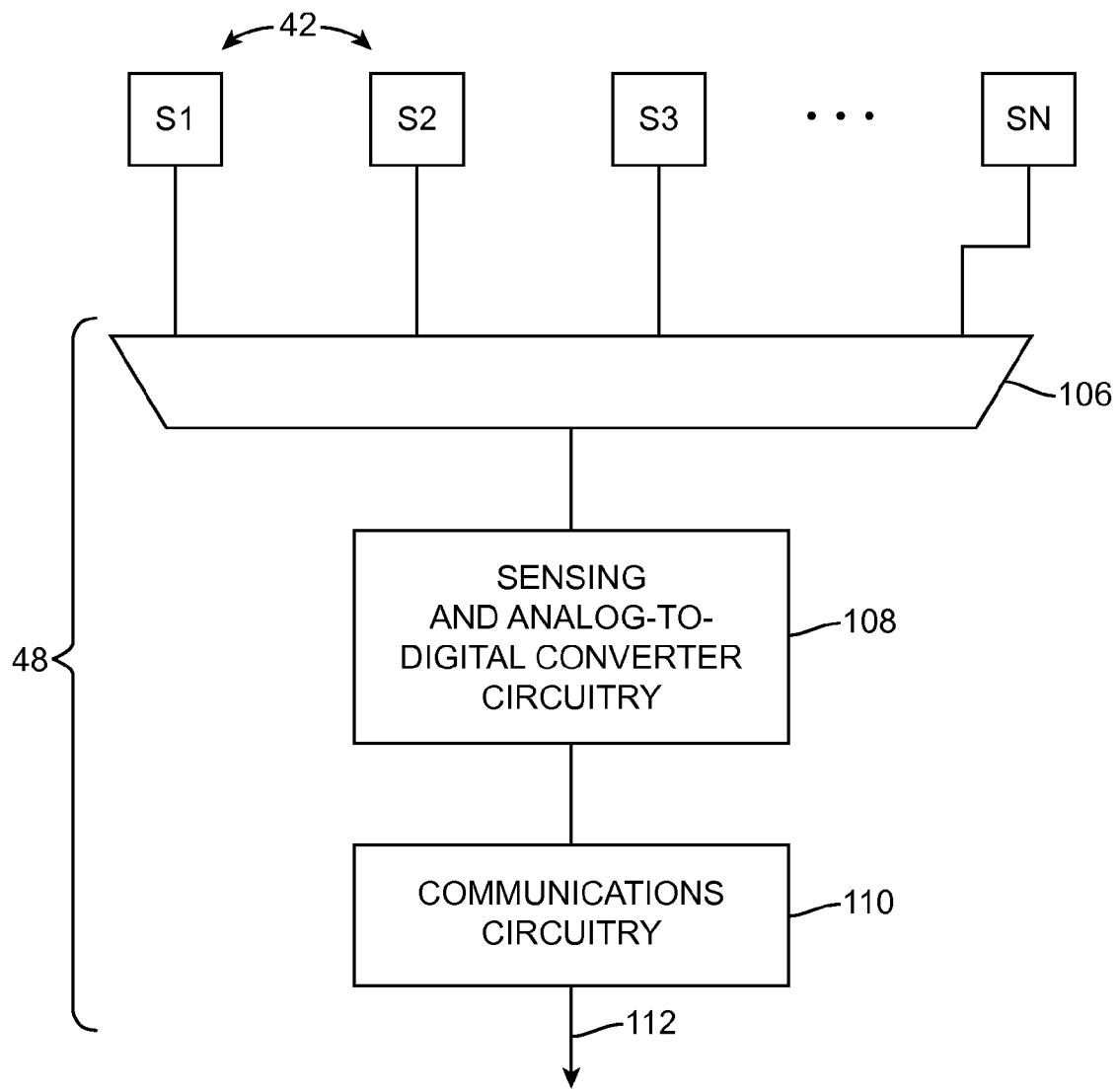
FIG. 18 is a circuit diagram of an illustrative array of liquid sensors and associated multiplexing circuitry that may be used to route signals from the sensors to control circuitry within an electronic device in accordance with an embodiment.

To gather comprehensive liquid intrusion data, it may be desirable to use multiple sensors within device 10. As shown in FIG. 18, device 10 may have multiple liquid contact sensors 42 such as illustrative sensors S1, S2, S3 . . . SN. Sensor control circuitry 48 may include multiplexing circuitry 106 that is coupled between liquid contact sensors 42 and sensing and analog-to-digital converter circuitry 108. Sensing and analog-to-digital converter circuitry 108 may be used to make resistance measurements and/or capacitance measurements using sensors 42 that are indicative of the amount of liquid present at sensors 42. Sensing and analog-to-digital converter circuitry 108 may digitize these liquid measurements. During operation, multiplexing circuitry 106 can switch each sensor 42 into use in sequence. This allows circuitry 108 to individually measure the amount of liquid present at each of sensors 42. If desired, each sensor 42 may be provided with a corresponding block of sensor and analog-to-digital converter circuitry 108 and digital liquid readings from the analog-to-digital converter circuitry in each block may be multiplexed digitally. Communications circuitry 110 (e.g., serial and/or parallel bus communications circuitry) may be used to transmit liquid readings from sensors 42 to other control circuitry 40 in device 10 via path 112.

Figure 19:
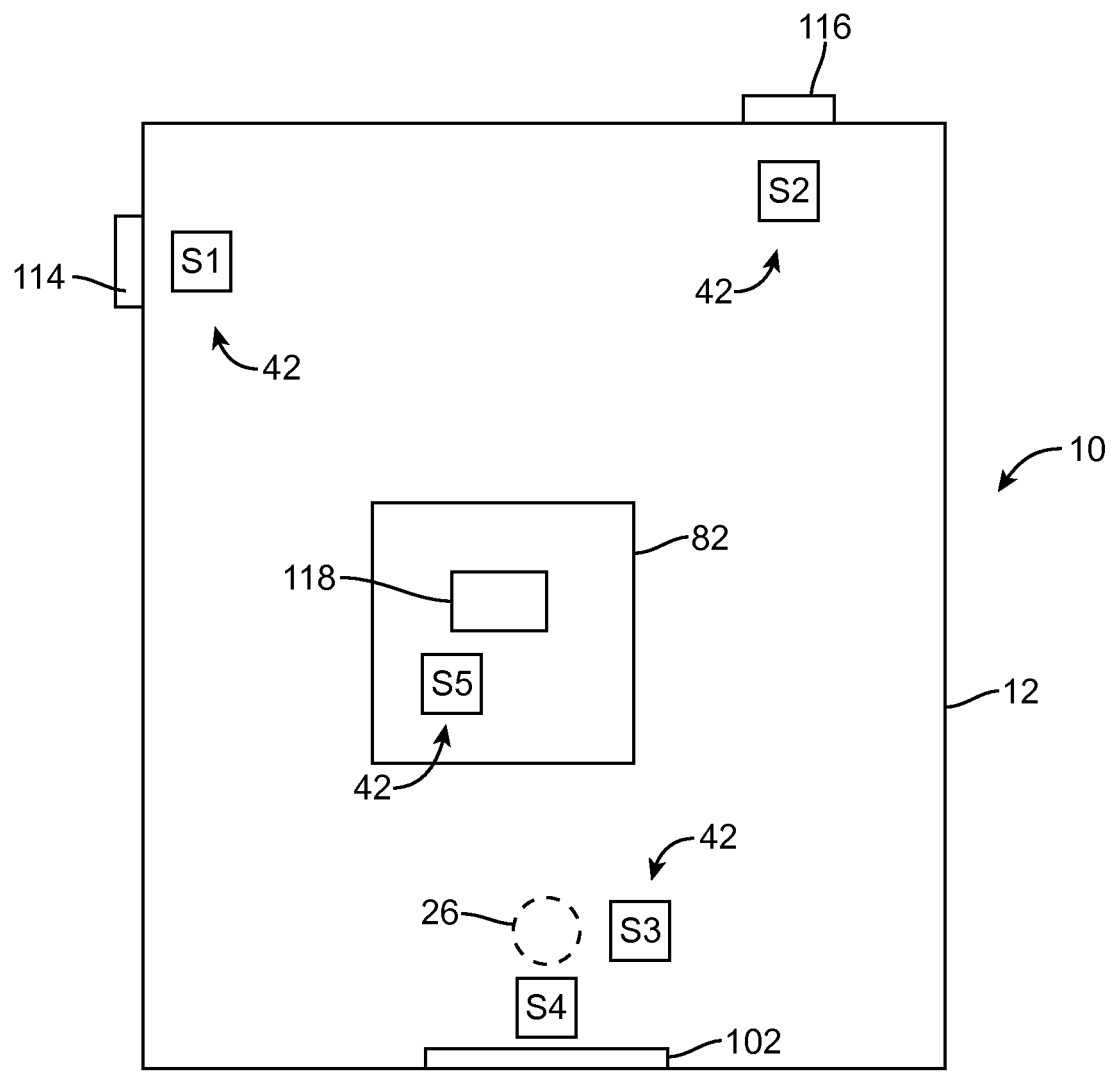
FIG. 19 is a top view of an electronic device in which liquid contact sensors have been located adjacent to areas that may potentially experience moisture intrusion and areas that contain sensitive components in accordance with an embodiment.

FIG. 19 is a top view of device 10 showing how sensors may be located at different locations within housing 12. In the example of FIG. 19, sensor S1 is located at button 114 (e.g., a ringer switch button or volume button), sensor S2 is located adjacent to sleep button 116, sensor S3 is located near menu button 26 so that liquid intrusion events at menu button 26 can be monitored, sensor S4 is located at connector 102, and sensor S5 is located on printed circuit 82 adjacent to integrated circuit 118. With this type of arrangement, liquid intrusion events of the type that may cause damage to device 10 can be monitored in detail. For example, a liquid intrusion event that exposes a sensitive component such as integrated circuit 118 to moisture can be detected, a liquid intrusion event that causes liquid to flow past connector 102 and sensor S4 before reaching button 26 and sensor S3 can be detected, liquid intrusion events that affect button 114 and sensor 42 without affecting button 116 and sensor S2 (or vice versa) may be detected, liquid intrusion events in which moisture is detected nearly simultaneously at all sensors S1, S2, S3, S4, and S5 may be detected, and other types of liquid intrusion events can be detected. By analyzing the data from these different types of events, the causes of different types of failures can be determined and design improvements can be made.

Figure 20:
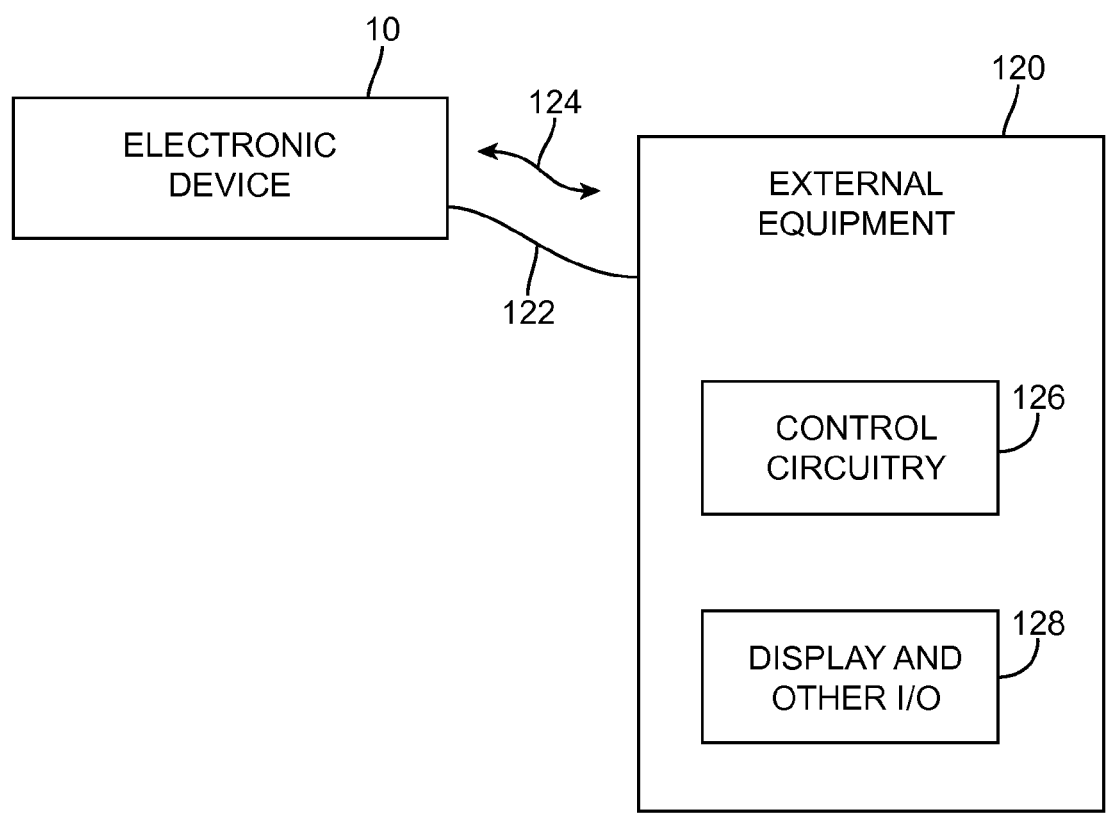
FIG. 20 is a diagram showing how external equipment such as a computer may be used to gather liquid contact sensor data from electronic liquid contact sensor structures in an electronic device over wired or wireless paths in accordance with an embodiment.

FIG. 20 is a system diagram showing how data on liquid exposure may be conveyed from device 10 to external equipment 120 using paths such as wired path 122 and wireless path 124. Path 122 may be a serial bus cable or other wired path. Wireless path 124 may be a wireless local area network path such as an IEEE 802.11 path (as an example). External equipment 120 may be based on a computer (e.g., a portable computer), a tablet computer, a handheld device, or other electronic equipment. Equipment 120 may contain control circuitry 126 such as one or more processors and storage devices. Displays and other input-output circuitry 128 may be used to present information to a user of equipment 120. For example, external equipment 120 may receive information from device 10 indicating that one of the liquid contact sensors in device 10 has detected exposure of device 10 to liquid. Upon receiving this information, device 10 may use control circuitry 126 and a display or other input-output device 128 to inform a user of equipment 120 (e.g., a technician) that device 10 has experienced liquid exposure. The technician may then take appropriate action (e.g., by repairing the portion of device 10 that was exposed to liquid, by replacing device 10 with a new device, etc.). The received data may also be used in performing failure analysis on device 10.

Figure 21:
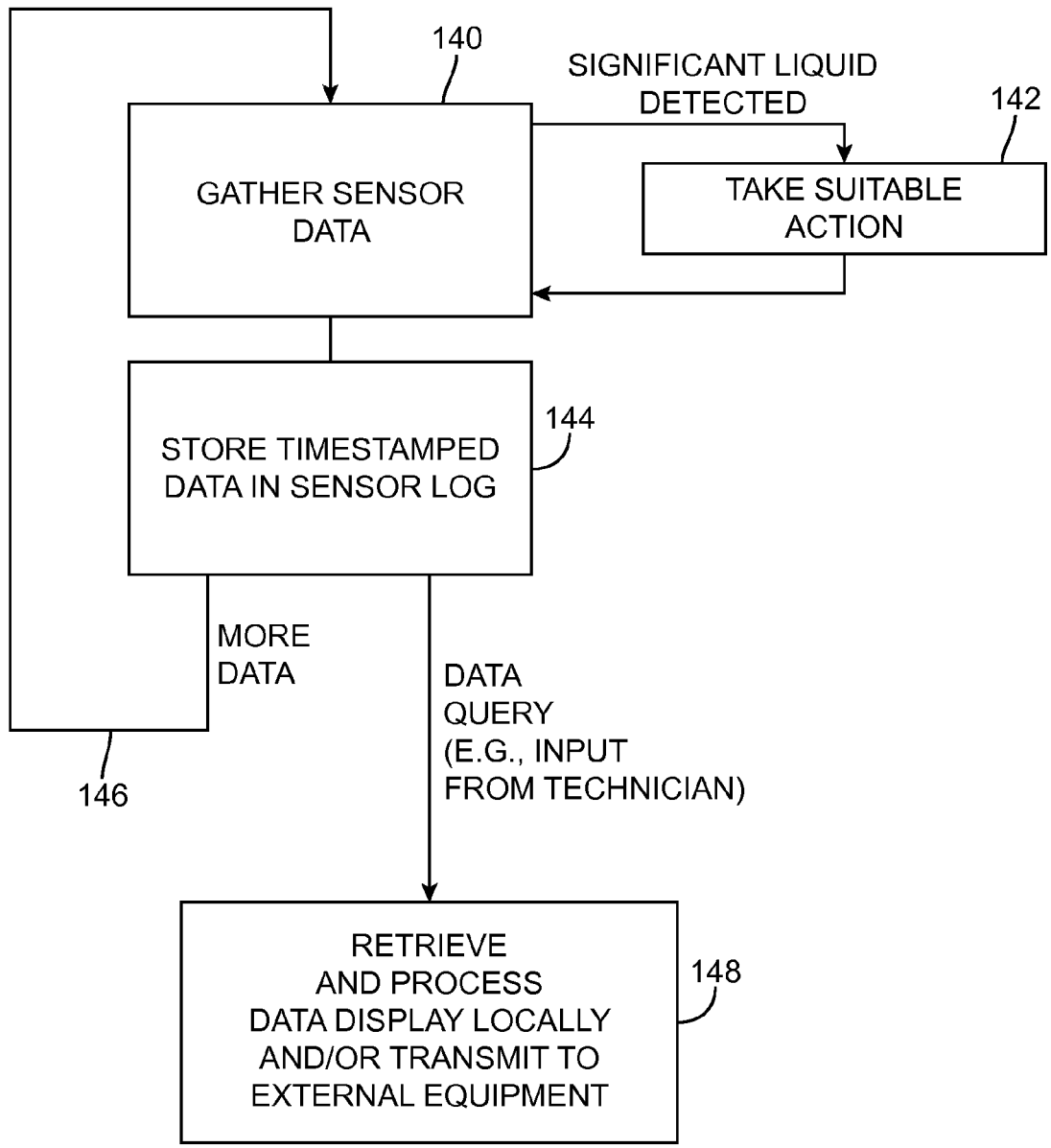
FIG. 21 is a flow chart of illustrative steps involved in gathering and processing liquid contact sensor data from one or more electronic liquid contact sensors in an electronic device in accordance with an embodiment of the present invention.

FIG. 21 is a flow chart of illustrative steps involved in using electrical liquid contact sensors to gather liquid exposure data and taking appropriate actions based on the gathered data.

At step 140, control circuitry in device 10 can use one or more liquid contact sensors 42 to gather data indicative of how much each sensor 42 has been exposed to liquid. In response to detecting liquid exposure, device 10 may take action at step 142. As an example, device 10 may shut off a display, integrated circuit, or other electrical components that can be damaged when operating while moist. Device 10 (e.g., a cellular telephone with a touch screen or other display) may display a warning message to the user of device 10 such as "device shutting down to prevent damage due to liquid exposure, please have this device serviced". Device 10 may also take actions such as sounding an audible alert, transmitting a wireless or wired message to computing equipment at a support center or other online destination, informing the user or others of the liquid exposure event using other techniques, etc.

At step 144, the liquid contact sensor data that has been gathered during step 140 may be stored in a sensor log (e.g., by storing the sensor data within storage in circuitry 40). The stored data may be time stamped (e.g., time and data information that is indicative of the time and data when the liquid exposure event was detected may be stored in conjunction with the liquid contact sensor data so that a log of time-stamped liquid contact sensor data is maintained for future analysis).

As indicated by line 146, processing may then loop back to step 140 so that additional data can be gathered from the one or more sensors 42 in device 10. If the sensors dry out (e.g., because moisture exposure levels were sufficiently low to allow the moisture to evaporate from sensors 42) and if device 10 was undamaged, device 10 can continue to operate normally and sensors 42 may be used to monitor for subsequent liquid exposure events.

When a technician desires to retrieve the logged liquid contact sensor data from device 10, the technician can use external equipment 120 to form a communications link with device 10 such as link 122 or link 124 of FIG. 20. Equipment 120 may then receive the sensor data from the control circuitry in device 10 (step 148) for processing. During processing operations, equipment 120 can analyze the liquid contact information from sensors 42 to determine whether device 10 was exposed to liquid, how much liquid device 10 was exposed to at each sensor location, the time and date of each exposure, the path taken by the liquid through device 12 (e.g., the route along which the liquid flowed as determined by mapping out the order of liquid exposure at each sensor), and other information about the nature of the liquid contact within device 10. This information can be used to determine how to repair device 10, whether device 10 should be scrapped or repaired, and can be used in enhancing future device designs to resist damage from liquid exposure. If desired, data processing operations at step 148 may be performed using control circuitry 40 in device 10 (e.g., so that data on liquid exposure can be presented to a user on display 14).

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
an electronic device housing;
a liquid contact sensor mounted in the electronic device housing, wherein the liquid contact sensor has first and second electrodes and first and second resistors coupled in series between the second electrode and ground; and
control circuitry in the electronic device housing that is coupled to the electrodes, wherein the control circuitry is configured to monitor liquid exposure events with the liquid contact sensor in which moisture enters the electronic device housing, and wherein the control circuitry monitors the voltage across the first resistor.

2. The electronic device defined in claim 1 further comprising:
storage in which time-stamped liquid contact sensor data from the liquid contact sensor is stored.

3. The electronic device defined in claim 1 wherein the liquid contact sensor is one of a plurality of liquid contact sensors within the electronic device housing, the electronic device further comprising:
multiplexing circuitry in the control circuitry that is coupled to each of the plurality of liquid contact sensors.

4. The electronic device defined in claim 1 further comprising:
a printed circuit, wherein the electrodes are formed on the printed circuit.

5. The electronic device defined in claim 4 wherein the electrodes include interdigitated fingers.

6. The electronic device defined in claim 4 wherein the printed circuit comprises a multilayer printed circuit, wherein the multilayer printed circuit has internal traces that extend to an edge of the printed circuit, and wherein the electrodes are formed from exposed edge portions of the internal traces on the edge of the printed circuit.

7. The electronic device defined in claim 1 wherein the electrodes include metal traces formed from multiple layers of metal.

8. The electronic device defined in claim 1 wherein the electrodes are separated by a gap, the liquid contact sensor further comprising a hydrophilic pad in the gap.

9. The electronic device defined in claim 1 further comprising a printed circuit covered with at least one coating, wherein the coating has an opening, and wherein the electrodes overlap the opening.

10. The electronic device defined in claim 9 wherein the coating includes a solder mask layer and a hydrophobic layer on the solder mask layer.

11. The electronic device defined in claim 1 further comprising a flexible printed circuit, wherein the electrodes comprise metal traces on the flexible printed circuit.

12. The electronic device defined in claim 11, wherein the flexible printed circuit comprises a curved portion, and wherein the metal traces are formed on the curved portion.

13. The electronic device defined in claim 1 further comprising a connector having contacts, wherein the electrodes are formed from a pair of the contacts.

14. The electronic device defined in claim 1 wherein the electrodes comprise integrated circuit contacts that include solder.

15. The electronic device defined in claim 1 wherein the electronic device housing has a connector port and wherein the liquid contact sensor is mounted adjacent to the connector port.

16. The electronic device defined in claim 1 further comprising:
a printed circuit; and
an integrated circuit mounted to the printed circuit, wherein the liquid contact sensor is located adjacent to the integrated circuit on the printed circuit.

17. The method defined in claim 1, wherein the second resistor limits an amount of current that flows between the first and second electrodes when moisture contacts the first and second electrodes.

18. A method, comprising:
gathering liquid contact sensor measurement data with a plurality of liquid contact sensors in a portable electronic device;
storing the liquid contact sensor measurement data in storage in the portable electronic device;
based on the liquid contact sensor measurement data from the plurality of liquid contact sensors, determining a location in the portable electronic device that has been exposed to moisture; and
based on the determined location in the electronic device, deactivating at least one electronic component in the portable electronic device.

19. The method defined in claim 18 wherein the portable electronic device comprises a device selected from the group consisting of: a portable computer, a cellular telephone, a media player, and a tablet computer, the method comprising:
providing the stored liquid contact sensor data from the portable electronic device to external equipment for analysis.

20. The method defined in claim 19 wherein the portable electronic device comprises a plurality of liquid contact sensors each of which has a respective pair of the liquid contact sensor electrodes and wherein gathering the liquid contact sensor data comprises using each of the plurality of liquid contact sensors to gather liquid contact sensor data.

21. The method defined in claim 18 wherein the liquid contact sensor measurement data comprises time-stamped liquid contact sensor measurement data that is periodically gathered, and wherein the periodically gathered time-stamped liquid contact sensor measurement data is stored in storage in the portable electronic device.

22. The method defined in claim 18, wherein the plurality of electronic liquid contact sensors comprises a first electronic liquid contact sensor having a first sensitivity to moisture mounted at a first location in the electronic device and a second electronic liquid contact sensor having a second sensitivity to moisture mounted at a second location in the electronic device.

23. A portable electronic device, comprising:
a housing;
a display in the housing;
a plurality of electronic liquid contact sensors in the housing;
an external connector port mounted in the housing, wherein at least one of the plurality of electronic liquid contact sensors has electrodes that are integrated into the external connector port; and
control circuitry coupled to the plurality of electronic liquid contact sensors, wherein the control circuitry and the electronic liquid contact sensors are configured to monitor for liquid intruding into the housing.

24. The portable electronic device defined in claim 23 wherein the electronic liquid contact sensors each comprise electrodes and wherein at least some of the electrodes comprise metal traces on a printed circuit.

25. The portable electronic device defined in claim 23 wherein the electronic liquid contact sensors each comprise electrodes and wherein at least some of the electrodes comprise pins in the external connector port.

26. The portable electronic device defined in claim 23 further comprising:
a flexible printed circuit; and
electrodes for the electronic liquid contact sensors that are formed on the flexible printed circuit.

27. The portable electronic device defined in claim 23 wherein the electronic liquid contact sensors each comprise electrodes and wherein the electrodes are formed from exposed edge portions of metal traces embedded within a multilayer printed circuit.

28. The portable electronic device defined in claim 23 wherein the control circuitry is configured to display information on the display in response to detecting liquid.

29. The portable electronic device defined in claim 28 wherein the display comprises a cellular telephone touch screen display.

30. The portable electronic device defined in claim 23 wherein the electronic liquid contact sensors each comprise electrodes, wherein at least some of the electrodes comprise metal traces on a printed circuit, and wherein at least some of the metal traces are covered by a layer of encapsulant.

31. The method defined in claim 23, wherein the external connector port is configured to mate with a corresponding external connector.

* * * * *